US006992911B2

(12) United States Patent
Takahashi

(10) Patent No.: US 6,992,911 B2
(45) Date of Patent: Jan. 31, 2006

(54) SEMICONDUCTOR MEMORY DEVICE

(75) Inventor: Kazuhiko Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 104 days.

(21) Appl. No.: 10/701,600

(22) Filed: Nov. 6, 2003

(65) Prior Publication Data

US 2004/0090814 A1 May 13, 2004

(30) Foreign Application Priority Data

Nov. 11, 2002 (JP) ....................................... 2002-326773

(51) Int. Cl.
*G11C 11/22* (2006.01)

(52) U.S. Cl. ....................... 365/145; 365/200; 365/210; 365/189.09; 365/65

(58) Field of Classification Search ................. 365/145, 365/200, 210, 189.09, 65
See application file for complete search history.

(56) References Cited

U.S. PATENT DOCUMENTS 5,572,459 A 11/1996 Wilson et al.
5,754,466 A * 5/1998 Arase ......................... 365/145
5,844,832 A * 12/1998 Kim ........................... 365/145
5,959,922 A 9/1999 Jung
6,809,976 B2 * 10/2004 Ooishi ........................ 365/210
6,839,289 B2 * 1/2005 Takahashi .............. 365/189.07

FOREIGN PATENT DOCUMENTS

JP 8-115596 5/1996
JP 11-144474 5/1999

* cited by examiner

*Primary Examiner*—Connie C. Yoha
(74) *Attorney, Agent, or Firm*—Volentine Francos & Whitt, PLLC

(57) ABSTRACT

A semiconductor memory device of the invention has a first reference cell connected to a first bit line and a first word line to be controlled; a second reference cell connected to the first bit line and a second word line to be controlled; a third reference cell connected to a second bit line and the first word line to be controlled; a fourth reference cell connected to the second bit line and the second word line to be controlled; and a word line select circuit connected to the first and second word lines for selecting the reference potential to be generated in the first bit line and the second bit line by selecting the first word line or second word line. Accordingly, the influence upon a semiconductor memory device in the yields of the reference cells is reduced in a semiconductor memory device using a ferroelectric capacitor, and a more highly reliable semiconductor memory device is to be provided.

14 Claims, 7 Drawing Sheets

SEMICONDUCTOR MEMORY DEVICE

BACKGROUND OF THE INVENTION

The present invention generally relates to a semiconductor memory device utilizing the polarization of a ferroelectric, particularly to a reference potential generation circuit for use in a ferroelectric memory circuit in order to determine a data state of a memory cell formed of a single transistor and a single ferroelectric capacitor.

A semiconductor memory device using a ferroelectric capacitor is a memory device utilizing the spontaneous polarization property of a ferroelectric used as a capacitive dielectric of a capacitor. On this account, it has characteristics that the refresh operation is unnecessary, which is needed for DRAM (Dynamic Random Access Memory) being a traditional semiconductor memory device, and data stored in memory cells is not lost irrespective of the state of a power source.

For the memory cell using the ferroelectric, there are those formed of a single MOS (Metal Oxide Semiconductor) transistor and a single ferroelectric capacitor (1T/1C) which is traditionally adopted in DRAM and those formed of two MOS transistors and two ferroelectric capacitors (2T/2C). Particularly, from increasing demands of downsizing and greater integration of semiconductor devices in recent years, attention is focused on the memory cell of the 1T1C structure in these memory cell configurations.

However, in the case of the semiconductor memory device using the ferroelectric memory cell of the 1T/1C structure, the space required for each memory cell is reduced to be suitable for greater integration, but the reference potential for amplifying the signals of the memory cells is needed when data stored in the memory cells is read out. More specifically, a reference potential generation circuit for generating the reference potential is required.

As a traditional reference generation circuit, it is described in JP-A-8-115596, for example.

FIG. 7 depicts a traditional example. The reference generation circuit is configured of bit lines BL and complementary bit lines BLb, both to be paired, reference cells RMC0 to RMC3 connected to each of the bit lines BL or the complementary bit lines BLb, reference word lines RWL, and a reference plate line RPL.

These reference cells RMC0 to RMC3 are disposed at the intersection of each of the bit lines and the reference word lines.

Among the reference cells RMC0 to RMC3, the reference cells RMC0 and RMC2 are connected to bit lines BL0 and BL1, which are configured of select transistors RT0 and RT2 operated by a reference word line RWL1 and ferroelectric capacitors H0 and H2 that one terminals are connected to the select transistors RT0 and RT2 and the others are connected to the reference plate line RPL. In addition, the reference cells RMC1 and RMC3 are connected to complementary bit lines BLb0 and BLb1, which are configured of select transistors RT1 and RT3 operated by a reference word line RWL0 and ferroelectric capacitors H1 and H3 that one terminals are connected to select transistors RT1 and RT3 and the others are connected to the reference plate line RPL.

Furthermore, a switching transistor T4 is connected between the two bit lines BL to which the reference cells RMC1 and RMC3 are connected, and a switching transistor T5 is connected between the two complementary bit lines BLb to which the reference cells RMC0 and RMC2 are connected. The switching transistors T4 and T5 are operated by a bit line equalizer signal EQ0 or EQ1.

The semiconductor memory device having the traditional 1T/1C structure has a reference control circuit for generating control signals for the reference potential generation circuit, word lines WL0 and WL1 and plate lines PL in addition to the reference potential generation circuit described above, and is configured of a sense amplifier circuit SA connected between one line of the bit lines BL or complementary bit lines BLb to which the reference cells RMC0 to RMC3 are connected and one line of the bit lines BL or complementary bit lines BLb to which memory cells MC0 to MC3 are connected, the sense amplifier circuit SA compares the potential generated in each of the bit lines and amplifies the signals of the memory cell.

Next, the readout operation in the semiconductor memory device having the traditional 1T/1C structure will be described. Here, the operation to read the data out of the MC0 into which Data 1 is written will be described, for example, where first data (Data 1) is set to power source potential Vdd and second data (Data 0) is set to ground potential Vss.

When the data of the MC0 connected to the bit line BL0 is read out, Data 1 is written into the complementary bit line BLb0 to which the potential reference potential is applied and into the reference cell connected to the BLb1 through the BLb0 and the switching transistor T4, the RMC1, for example, and Data 0 is written into the other RMC3 beforehand.

First, when a memory cell block including the MC0 is selected, a block select signal becomes active, and then the reference control circuit is activated by receiving the block select signal.

Subsequently, when the word line WL0 is activated and then the plate line PL0 is activated, the memory cell MC0 connected to these lines is selected, and the charge corresponding to the data written in the MC0 is carried to the BL0. At the same time, the reference word line RWL0 and the reference plate line RPL are activated, and the charge corresponding to Data 1 written in the RMC1 connected to these lines is carried to the BLb0, and the charge corresponding to Data 0 written in the RMC3 is carried to the BLb1.

After that, the bit line equalizer signal EQ0 is activated to operate switching transistor T4, and then the BLb0 is connected to the BLb1. More specifically, the BLb0 and BLb1 are short-circuited. At this time, the potential of each of the complementary bit lines BLb0 and BLb1 is turned to the intermediate potential of the potential held by each of the complementary bit lines before the short circuit because the capacitances held by the BLb0 and BLb1 are nearly the same. The intermediate potential becomes the reference potential used when data is read out of the memory cell MC0.

In this manner, after the reference potential is generated in the BLb0, the reference control circuit turns the EQ0 inactive to separate the BLb0 from the BLb1. At the same time, a sense amplifier circuit SA000 is activated, and the potential corresponding to Data 1 stored in the MC0 that is amplified by the SA000 and shown in the BL0 and the reference potential shown in the BLb0 are outputted to a digit line DB and complementary digit bit line DBb as data.

SUMMARY OF THE INVENTION

In the case of the reference potential generation circuit based on the reference cell having the traditional ferroelectric capacitor, when defective conditions occur in the reference memory cell RMC1, for example, caused by process variations, a malfunction is likely to occur in data readout of the memory cell (the memory cell connected to the bit lines BL0 and BL1) to read out data by comparing the reference potential generated in the complementary bit line BLb0 connected to the RMC1 and in the complementary bit line BLb1 short-circuited with the complementary bit line BLb0.

In the case of the traditional reference potential generation circuit for generating the reference potential based on the data held by the reference memory cell, when the reference cell RMC1 that is supposed to hold Data 1 is under defective conditions, a desired potential is outputted to the bit lines BL0 and BL1 and the complementary bit line BLb0 other than the complementary bit line BLb1, but the potential (ΔV1) corresponding to Data 1 is not outputted to the complementary bit line BLb1, and the ground potential (0 V), for example, is outputted. More specifically, even though the BLb0 and BLb1 are short-circuited, only the reference potential of ΔV0/2 is generated in the BLb0 and BLb1 because the BLb0 is ΔV0 and the BLb1 is 0 V.

In this case, when the reference potential is generated in the BLb0 and BLb1 and then the sense amplifier circuits SA000 and SA001 connected to the BLb0 or BLb1 are activated to read data out of the memory cell MC0 connected to the BL0 and data held in the memory cell MC2 connected to the BL1, the following problem arises particularly when Data 0 held in the MC0 and MC2 is read out.

When the data held in the MC0 and MC1 is read out, the sense amplifier circuits SA000 and SA001 connected between the bit lines and the complementary bit lines to be paired (BL0 and BLb0, BL1 and BLb1) are activated, the potential difference from the reference potential is compared and then the data held in the memory cells (the MC0 and MC1) is read out. However, when the reference potential generated in the BLb0 and BLb1 is the potential lower than the intermediate potential of ΔV0 and ΔV1 due to the defective conditions of the RMC1 is, particularly when the reference potential is the potential lower than ΔV0 (for example, ΔV0/2), the reference potential (ΔV0/2) of the BLb0 and BLb1 always becomes the potential lower than the potential (ΔV0) corresponding to Data 0. Therefore, the output of the sense amplifier circuits SA is likely to be Data 1, not Data 0.

More specifically, even though defective conditions do not occur in the entire memory cells MC connected to the BL0 and the BL1 which use the RMC1 as the reference cell for generating the reference potential, the normal operation of the semiconductor memory device is greatly affected when defective conditions occur in one of the reference memory cells RMC1. The defective conditions of the reference memory cells RMC greatly affect yields more than the defective conditions of the memory cells MC do.

Then, an object of the invention is to provide a reference potential generation circuit to reduce an influence upon the yields of reference cells with the downsizing and greater integration of a semiconductor memory device maintained, and to provide a more highly reliable semiconductor memory device.

In order to solve the problems, a first semiconductor memory device according to the invention includes:

a first bit line;

a memory cell formed of a first transistor connected to the first bit line and a first ferroelectric capacitor connected to the first transistor;

a second bit line;

a first reference cell formed of a second transistor connected to the second bit line and to a first word line to be controlled and a second ferroelectric capacitor connected to the second transistor, the first reference cell for holding a potential corresponding to predetermined data;

a third bit line;

a second reference cell formed of a third transistor connected to the third bit line and to the first word line to be controlled and a third ferroelectric capacitor connected to the third transistor, the second reference cell for holding a potential corresponding to predetermined data;

a first redundant reference cell formed of a fourth transistor connected to the second bit line and to a second word line to be controlled and a fourth ferroelectric capacitor connected to the fourth transistor, the first redundant reference cell for holding a potential corresponding to predetermined data;

a second redundant reference cell formed of a fifth transistor connected to the third bit line and to the second word line to be connected and a fifth ferroelectric capacitor connected to the fifth transistor, the second redundant reference cell for holding a potential corresponding to predetermined data;

a switching circuit connected between the second bit line and the third bit line for electrically connecting the second bit line to the third bit line in response to a first control signal and generating a reference potential in the second bit line and the third bit line;

a data read-out circuit connected to any one of the second bit line and the third bit line and to the first bit line for comparing the reference potential with a potential generated in the first bit line; and a word line select circuit for selecting any one of the first word line and the second word line and generating the reference potential in the second bit line and the third bit line by the first and second redundant reference cells by selecting the second word line when the first or second reference cell is defective.

In addition, a second semiconductor memory device according to the invention includes:

a first bit line;

a first memory cell formed of a first transistor connected to the first bit line and a first ferroelectric capacitor connected to the first transistor;

a second bit line;

a first reference cell formed of a second transistor connected to the second bit line and to a first word line to be controlled and a second ferroelectric capacitor connected to the second transistor, the first reference cell for holding a potential corresponding to predetermined data;

a third bit line;

a second reference cell formed of a third transistor connected to the third bit line and to the first word line to be controlled and a third ferroelectric capacitor connected to the third transistor, the second reference cell for holding a potential corresponding to predetermined data;

a first redundant reference cell formed of a fourth transistor connected to the second bit line and to a second word line to be controlled and a fourth ferroelectric capacitor connected to the fourth transistor, the first redundant reference cell for holding a potential corresponding to predetermined data;

a second redundant reference cell formed of a fifth transistor connected to the third bit line and to the second word line to be controlled and a fifth ferroelectric capacitor connected to the fifth transistor, the second redundant reference cell for holding a potential corresponding to predetermined data;

a first switching circuit connected between the second bit line and the third bit line for electrically connecting the second bit line to the third bit line in response to a first control signal and generating a first reference potential in the second bit line and the third bit line;

an ordinary array having a first data read-out circuit that is activated by a first activating signal and connected to any one of the second bit line or third bit line and to the first bit line for comparing the first reference potential with a potential generated in the first bit line;

a fourth bit line;

a second memory cell formed of a sixth transistor connected to the fourth bit line and a sixth ferroelectric capacitor connected to the sixth transistor;

a fifth bit line;

a third reference cell formed of a seventh transistor connected to the fifth bit line and to the first word line to be controlled and a seventh ferroelectric capacitor connected to the seventh transistor, the third reference cell for holding a potential corresponding to predetermined data;

a sixth bit line;

a fourth reference cell formed of an eighth transistor connected to the sixth bit line and to the first word line to be controlled and an eighth ferroelectric capacitor connected to the eighth transistor, the fourth reference cell for holding a potential corresponding to predetermined data;

a third redundant reference cell formed of a ninth transistor connected to the fifth bit line and to the second word line to be controlled and a ninth ferroelectric capacitor connected to the ninth transistor, the third redundant reference cell for holding a potential corresponding to predetermined data;

a fourth redundant reference cell formed of a tenth transistor connected to the sixth bit line and to the second word line to be controlled and a tenth ferroelectric capacitor connected to the tenth transistor, the fourth redundant reference cell for holding a potential corresponding to predetermined data;

a second switching circuit connected between the fifth bit line and the sixth bit line for electrically connecting the fifth bit line to the sixth bit line in response to the first control signal and generating a second reference potential in the fifth bit line and the sixth bit line;

a redundant array having a second data read-out circuit that is activated by a second activating signal and connected to any one of the fifth bit line and the sixth bit line and to the fourth bit line for comparing the second reference potential with a potential generated in the fourth bit line; and a word line select circuit for selecting any one of the first word line and the second word line, generating the reference potential in the second bit line and the third bit line by the first and second redundant reference cells by selecting the second word line when the first or second reference cell is defective, and generating the reference potential in the fifth bit line and the sixth bit line by the third and fourth redundant reference cells by selecting the second word line when the third or fourth reference cell is defective.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENT

Hereafter, a first embodiment according to the invention will be described in detail with reference to the drawings.

Figure 1:
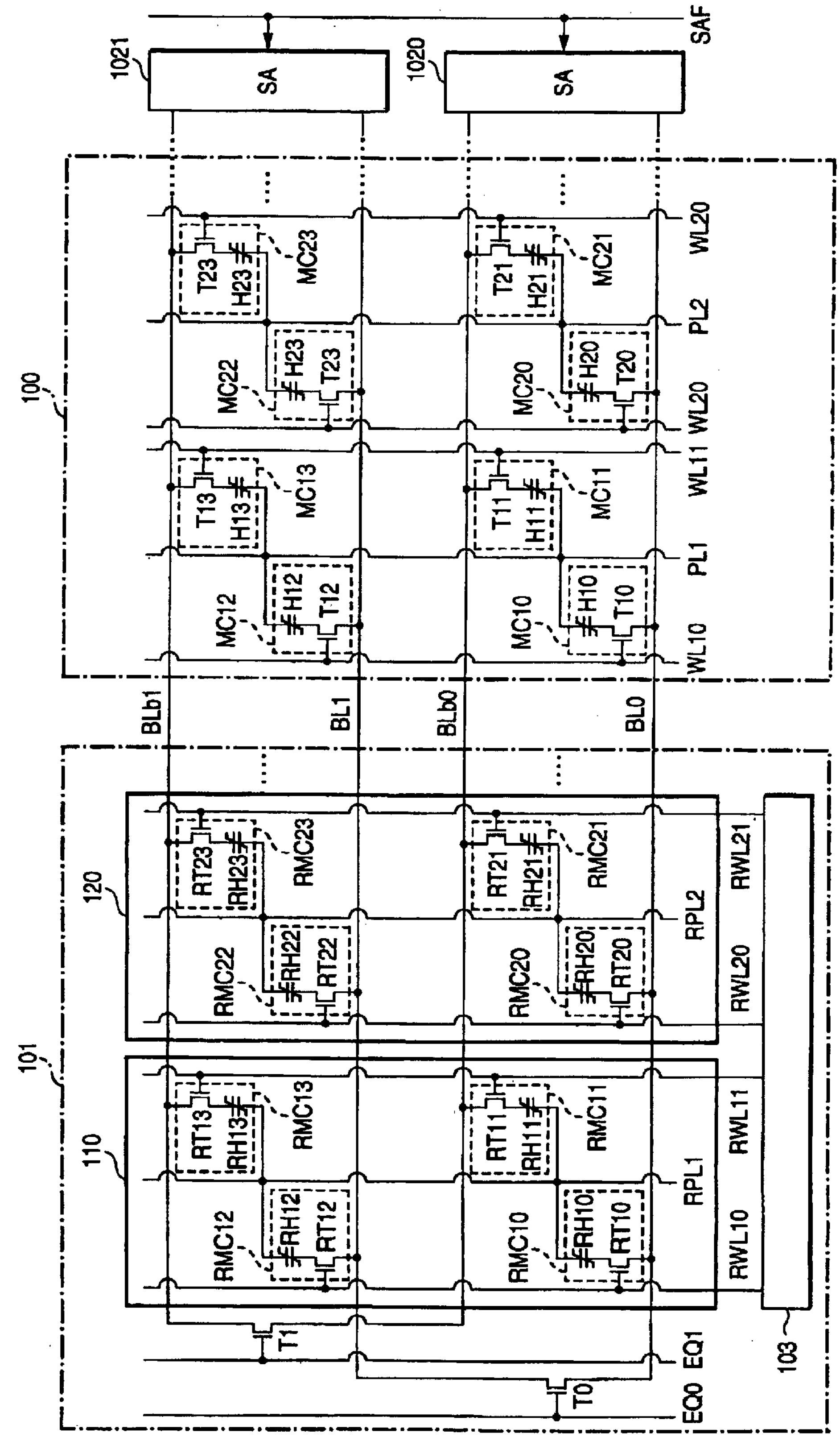
FIG. 1 is a diagram illustrating the essential part of a semiconductor memory device of a first embodiment according to the invention.

FIG. 1 depicts a reference potential generation circuit and a part of its peripheral circuit in a semiconductor memory device of a first embodiment.

In addition to the reference potential generation circuit shown in FIG. 1, the semiconductor memory device of the first embodiment is configured of the peripheral circuit formed of a reference word line control circuit for generating control signals of the reference potential generation circuit, memory cells MC0 to MC3 disposed at the intersections of bit lines BL and complementary bit lines BLb with word lines WL0 and WL1 for storing data, and a sense amplifier circuit SA (data read-out circuit) connected between the bit line BL to which any one of the memory cells MC0 to MC3 is connected and the complementary bit line BLb to which the corresponding reference cell is connected, the sense amplifier circuit SA compares the potential generated in each of the bit lines BL and the complementary bit lines BLb and amplifies signals of the memory cells.

In the reference potential generation circuit of the first embodiment, the bit lines BL and the complementary bit lines BLb to which the memory cells are connected, both to be paired, reference word lines RWL, and reference plate lines RPL are provided. At the intersection of each of the bit lines and the reference word lines, reference cells RMC10 to RMC13 and RMC20 to RMC23 are disposed.

Among the reference cells RMC10 to RMC13, the reference cells RMC10 and RMC12 are connected to the bit lines BL, which are configured of select transistors RT10 and RT12 operated by the reference word line RWL10 and ferroelectric capacitors H10 and H12 that one terminals are connected to the select transistors RT10 and RT12 and the others are connected to a reference plate line RPL1. In addition, the reference cells RMC11 and RMC13 are connected to the complementary bit lines BLb, which are configured of select transistors RT11 and RT13 operated by a reference word line RWL11 and ferroelectric capacitors H11 and H13 that one terminals are connected to the select transistors RT11 and RT13 and the others are connected to the reference plate line RPL1.

A reference cell pair 110 is configured of the reference cells RMC10 to RMC13.

Furthermore, in the semiconductor memory device of the first embodiment, redundant reference cells RMC20 to RMC23 are provided for the bit line pairs to be paired. The redundant reference cell is the reference cell that is connected to the same bit line pair other than the reference cells RMC10 to RMC13 for generating the reference potential in general. For example, it is the cell that is used when any one of the reference cells RMC10 to RMC13 is a defective cell and generates the correct reference potential in a desired bit line. Among the redundant reference cells RMC20 to RMC23, the reference cells RMC20 and RMC22 are connected to the bit lines BL, which are configured of select transistors RT20 and RT22 operated by a reference word line RWL20 and ferroelectric capacitors H20 and H22 that one terminals are connected to the select transistors RT20 and RT22 and the others are connected to a reference plate line RPL2. In addition, the reference cells RMC21 and RMC23 are connected to the complementary bit lines BLb, which are configured of select transistors RT21 and RT23 operated by a reference word line RWL21 and ferroelectric capacitors H21 and H23 that one terminals are connected to the select transistors RT21 and RT23 and the others are connected to the reference plate line RPL2.

A reference cell pair 120 is configured of the reference cells RMC20 to RMC23.

More specifically, it is configured to provide two or more, a plurality of the reference cell pairs 110 and 120 are provided for a single bit line pair (BL0 and BLb0, BL1 and BLb1).

Furthermore, a switching transistor T0 is connected between the two bit lines BL to which the reference cells RMC10, RMC12, RMC20 and RMC22 are connected, and a switching transistor T1 is connected between the two complementary bit lines BLb to which the reference cells RMC11, RMC13, RMC21 and RMC23 are connected. The switching transistors T0 and T1 are operated by a bit line equalizer signal EQ0 or EQ1, which generate the reference potential used in data readout of the memory cells by short-circuiting between two bit lines connected to the switching transistors T0 and T1.

Next, the readout operation of the semiconductor memory device in the embodiment will be described. For example, in the case of reading data out of the memory cells MC10, MC12, MC20, MC22 and so on, which are connected to the BL0 and BL1, when defective conditions occur in the reference cell RMC11 of the reference cell pair 110 due to process variations, the RMC21 and RMC23 similarly connected to the BLb0 and BLb1 and disposed in the reference cell pair 120 are used to generate the reference potential in the BLb0 and BLb1 instead that the RMC11 and RMC13 are used as the reference memory cells to generate the reference potential in the BLb0 and BLb1. More specifically, instead of the reference word line RWL11 and the reference plate line RPL1 of the reference cell pair 110, the reference word line RWL21 and the reference plate line RPL2 are turned to an active state, the reference cells RMC21 and RMC23 disposed in the reference cell pair 120 with no defective conditions are used to generate the correct reference potential in the BLb0 and BLb1. After that, data is read out of the memory cells MC10, MC12, MC20, MC22 and so on by the same method as that of the traditional semiconductor memory device.

In the semiconductor memory device of the first embodiment described above, a plurality of the reference cell pairs is provided for a single bit line pair. Thus, in the case where the reference cell under defective conditions is included, another reference cell pair can be selected from the plurality of the reference cell pairs, and the malfunction of the normal memory cell with the defective conditions of a single reference memory cell such as the malfunction that Data 1 is outputted in spite of the fact that Data 0 is held can be avoided. Consequently, the yields of a memory cell array can be improved.

Figure 2:
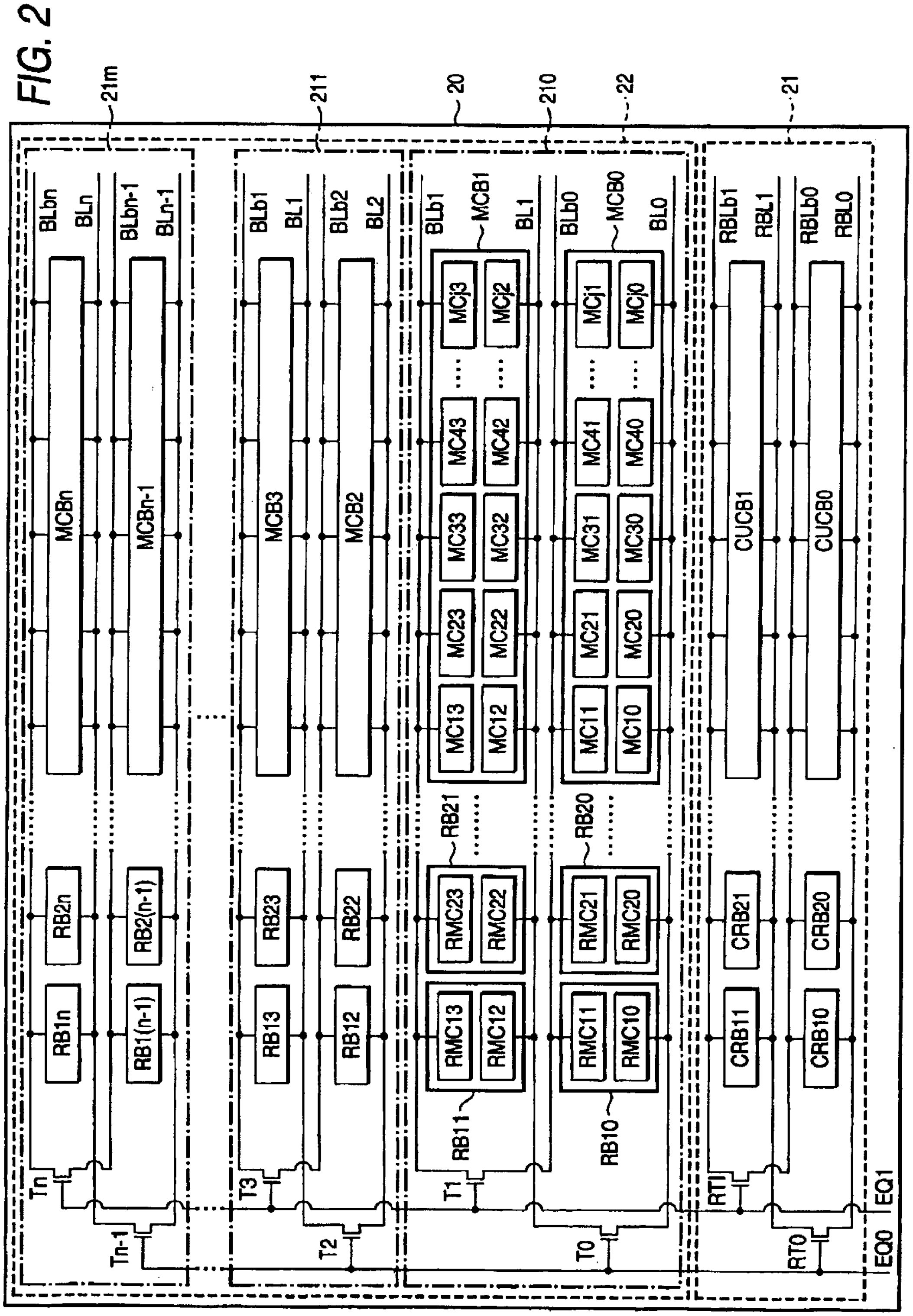
FIG. 2 is a block diagram illustrating the configuration of a memory cell array of the semiconductor memory device of the first embodiment according to the invention.

In addition, as shown in FIG. 2, it is acceptable that a memory cell array 20 of the semiconductor memory device in the first embodiment is configured to have memory cell blocks MCB0, MCB1 to MCBn having memory cells MC10, MC11 to MCj0 and MCj1 formed of ferroelectric capacitors and select transistors, not shown; a reference block RB10 formed of a reference memory cell RMC10 connected to a bit line BL0 and a reference memory cell RMC11 connected to a complementary bit line BLb0; memory cell blocks MCB0 and MCB1; reference blocks RB; switching transistors T0 and T1 for short-circuiting the adjacent bit line BL or complementary bit line BLb in order to generate the reference potential; column redundant memory cell blocks CMCB0 and CMCB1 formed of ferroelectric capacitors and select transistors, not shown; column redundant reference blocks CRB connected to a redundant bit line RBL0 and a complementary redundant bit line RBLb0; and redundant switching transistors RT0 and RT1 for short-circuiting the adjacent bit line BL or complementary bit line BLb in order to generate the reference potential by a column redundant array.

The semiconductor memory device shown in FIG. 2 further has a replacement unit formed of the bit lines BL, the complementary bit lines BLb, the memory cell blocks MCB, the reference blocks RB, and the switching transistors T0 and T1, and a single memory cell array is configured of an ordinary array formed of a plurality of replacement units 210 to 21*m* and the column redundant array formed of the redundant bit lines RBL, the complementary redundant bit lines RBLb, the column redundant memory cell blocks CMCB, the column redundant reference blocks CRB and the switching transistors RT0 and RT1.

In this manner, a column redundant array 21 disposed in the memory cell array 20 is also configured in which a plurality of the column redundant reference blocks (CRB10 and CRB12, CRB20 and CRB22), that is, a plurality of the reference cell pairs is provided for a single bit line pair (RBL0 and RBLb0, RBL1 and RBLb1). Therefore, for example, in the case where defective conditions exist in many places such as in the memory cell block MCB0 and in a reference block RB12, the replacement unit 210 having the memory cell block MCB0 with defective conditions is repaired by the column redundant array 21, and the reference block RB12 is repaired by a reference block RB22 connected to the same bit line to which the RB12 is connected instead of the RB12.

More specifically, data of the memory cell block MCB0 is correctly outputted to the bit line by the column redundant array 21, and the correct reference potential generated in the reference block RB22 is outputted to the bit line in the replacement unit 211. Particularly, since a desired potential (Data 0 or Data 1) is outputted to a bit line BL2 and a complementary bit line BLb2 in the reference block RB22, the correct reference potential is generated in a bit line BL3 or complementary bit line BLb3 to be paired with the bit line BL2 or complementary bit line BLb2 in generating the reference potential. Thus, the entire memory cells MC in the memory cell blocks MCB2 and MCB3 connected to the bit lines BL2 and BL3 and the complementary bit lines BLb2 and BLb3 can be operated correctly.

In addition to this, in the semiconductor memory device shown in FIG. 2, a plurality of the reference blocks RB is provided for each of the bit line pairs of the plurality of the replacement units 210, 211 to 21*m* forming the ordinary array. On this account, even though defective conditions further occur in a reference block RB1*n*, a reference block RB2*n* is used instead of the reference block RB1*n*, and then the memory cells in memory cell blocks MCB(n−1) and MCBn can be operated correctly.

More specifically, according to the semiconductor memory device shown in FIG. 2 having a plurality of the reference pairs provided for the bit line pairs in each of the replacement units and the column redundant array, the memory cell array 20 can be repaired even though a large number of defective cells are generated, and the yields of the memory cell array can be further improved.

Figure 3:
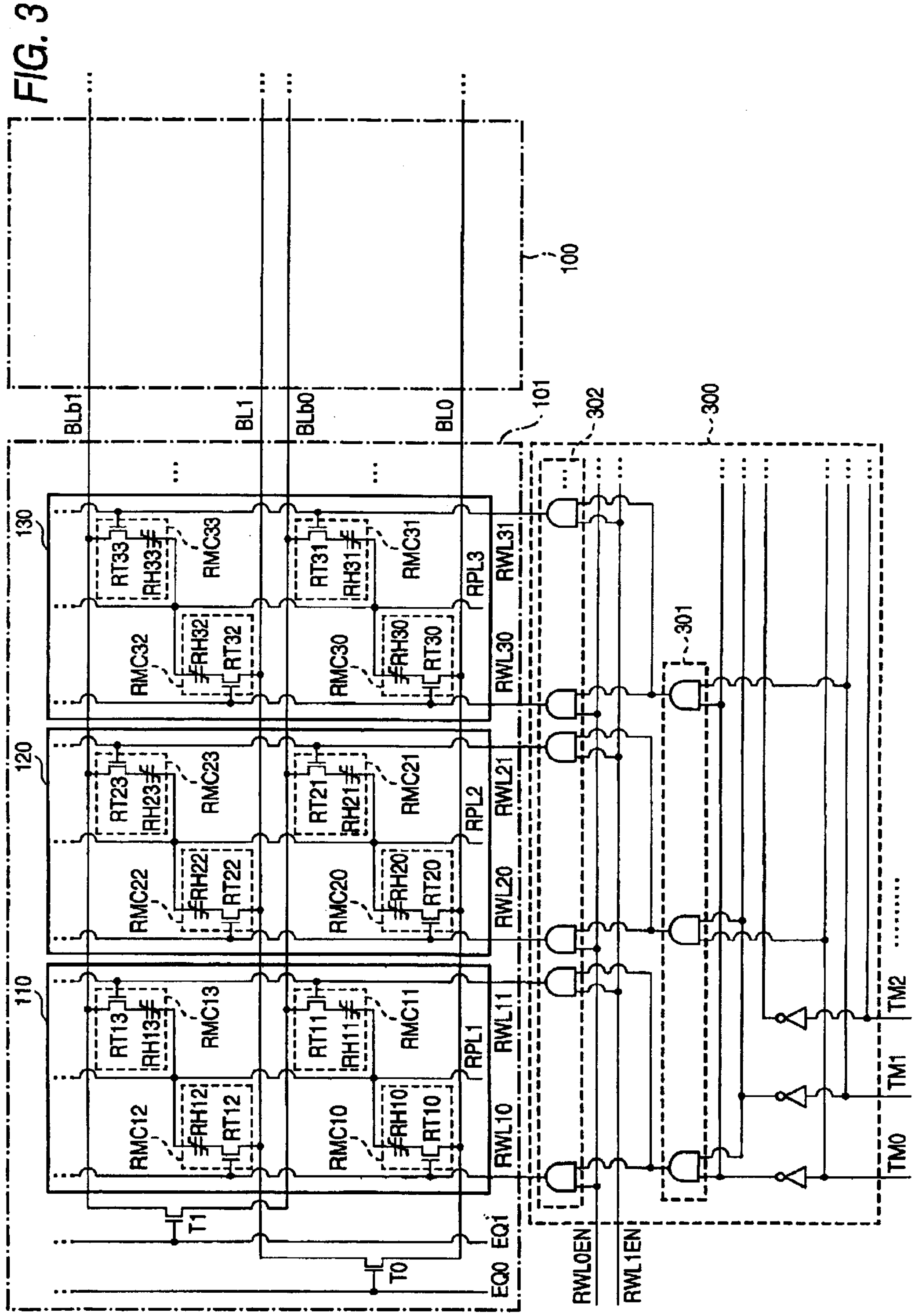
FIG. 3 is a circuit diagram illustrating the essential part of the semiconductor memory device and a circuit diagram illustrating a reference word line control circuit of the first embodiment according to the invention.

Furthermore, as shown in FIG. 3, for the semiconductor memory device of the first embodiment having the plurality of the reference pairs provided for a single bit line pair, a reference word line control circuit 300 can be provided which creates reference cell select signals for selecting a reference cell to generate the reference potential based on external input signals TM0, TM1 and TM2 such as test mode signals to set a test mode.

The reference word line control circuit 300 shown in FIG. 3 is configured to provide three reference cell pairs 110, 120 and 130 for a single bit line pair. Reference word line enable signals RWL0EN and RWL1EN and the external input signals TM0 to TM2 are inputted to the reference word line control circuit 300, which has a first AND circuit 301 to which the external input signals TM0 to TM2 and the inverted signals of each of the external input signals are inputted and a second AND circuit 302 to which the reference word line enable signals RWL0EN and RWL1EN and the output of the first AND circuit 301 are inputted.

The reference word line enable signals RWL0EN and RWL1EN inputted to the second AND circuit 302 are the signals that activate any one of a plurality of the reference word lines RWL (RWL10 or RWL11, RWL20 or RWL21, RWL30 or RWL31) in each of the reference cell pairs.

In the semiconductor memory device of the first embodiment, the use of the reference word line control circuit 300 having this configuration allows the desired reference word lines RWL10, RWL11, RWL20, RWL21, RWL30 and RWL31 to be selected and activated by the external input signals TM0, TM1 and TM2 and the reference word line enable signals RWL0EN and RML1EN from the outside of the semiconductor memory device.

Here, the change in the polarization property (hysteresis curve) of the ferroelectric capacitor forming a part of the memory cell and the reference memory cell will be described with FIG. 4.

In the ferroelectric capacitor using a ferroelectric film such as a metal oxide film as a capacitive dielectric, the polarization property of each of the ferroelectric capacitors is varied because of process variations generated in the fabrication process of semiconductor devices such as the variation in the state of a fabrication apparatus for use. As the result, there are the distributions of ΔV0 and ΔV1.

Figure 4:
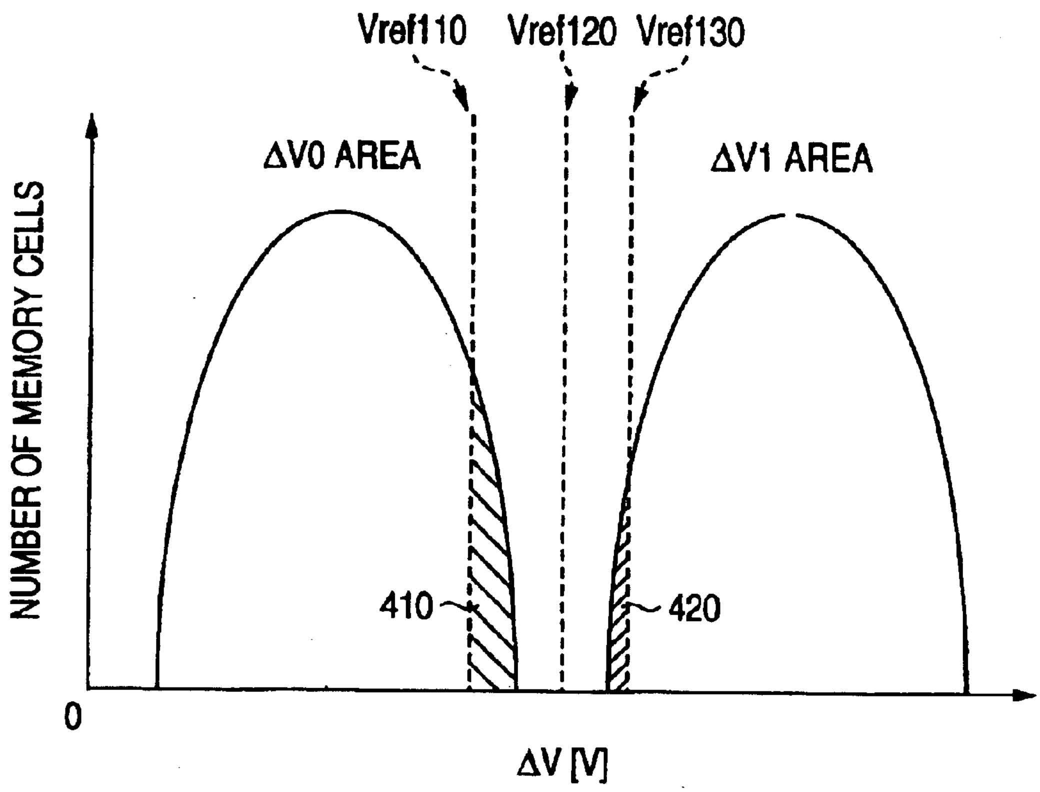
FIG. 4 is a distribution diagram illustrating the potential of the bit line when data is read out of each of the memory cells in the semiconductor memory device of the first embodiment according to the invention.

FIG. 4 depicts the distributions of ΔV0 and ΔV1 of the ferroelectric capacitors H10, H20, H30, H12, H22 and H32 included in the entire memory cells MC10, MC20, MC30, MC12, MC22 and MC32 connected to the bit lines BL0 and BL1, the reference potential Vref 110 generated by the RMC11 and RMC13 disposed in the reference cell pair 110, the reference potential Vref 120 generated by the RMC21 and RMC23 disposed in the reference cell pair 120, and the reference potential Vref 130 generated by the RMC31 and RMC33 disposed in the reference cell pair 130.

Now, referring to a distribution diagram shown in FIG. 4, in the case where the reference potential Vref 110 generated by the reference cell pair 110 is used to read data out of the bit lines BL0 and BL1, there is a portion 410 that the reference potential Vref 110 is overlapped with the distribution of the potential ΔV0 supposed to correspond to Data 0. More specifically, in the memory cell having the distribution of ΔV0 in the portion 410 of the potential ΔV0 supposed to correspond to Data 0 (the right side of the reference potential Vref 110), it is determined that the potential transferred to the corresponding bit line is higher than the potential Vref 110 even though the held data is Data 0. Therefore, the error data of Data 1 is read out and outputted from the sense amplifier circuit SA. In addition, referring to the distribution diagram shown in FIG. 4, in the case where the reference potential Vref 130 generated by the reference cell pair 130 is similarly used to read data out of the bit lines BL0 and BL1, there is a portion 420 that the reference potential Vref 130 is overlapped with the distribution of the potential ΔV1 supposed to correspond to Data 1. More specifically, in the memory cell having the distribution of ΔV1 in the portion 420 of the potential ΔV1 supposed to correspond to Data 1 (the left side more than the reference potential Vref 130), it is determined that the potential transferred to the corresponding bit line is lower than the reference potential Vref 130 even though the held data is Data 1. Therefore, the error data of Data 0 is read out and outputted from the sense amplifier circuit SA.

Correspondingly, referring to the distribution diagram shown in FIG. 4, in the case where the reference potential Vref 120 generated by the reference cell pair 120 is used to read data out of the bit lines BL0 and BL1, there is no portion that is overlapped with the reference potential Vref 120 in the distributions of ΔV0 and ΔV1. Therefore, data is correctly read out of the entire memory cells, and incorrect data readout can be prevented.

As described above, in data readout of the memory cell showing the distributions in FIG. 4, it is apparent that it is desirable to select the most suitable reference cell pair 120 when defective conditions do not occur in the reference cells forming each of the reference cell pairs 110, 120 and 130.

In the reference word line control circuit 300 shown in FIG. 3, any one of the reference word line enable signals RWLOEN and RWL1EN is turned to high level, the other is turned to low level, the high level is inputted to the TM0, and the low level is inputted to the TM1 and TM2 among the external input signals TM0 to TM2. Thus, the reference cell pair 120 to generate the most suitable potential Vref 120 can be selected.

Furthermore, when the reference word line control circuit 300 shown in FIG. 3 is adapted which has the configuration allowing a desired reference cell pair to be selected by the external input signals, the most suitable reference cell pair can be selected by the following method in actual semiconductor devices as well.

Hereafter, a method for selecting the most suitable reference cell pair will be described in the case of using the reference word line control circuit shown in FIG. 3.

First, the input signals TM0, TM1, TM2 and so on to be externally inputted to the reference word line control circuit 300 are all turned to low level (hereafter, it is denoted by L). In this case, the reference cell pair 110 is selected, and the reference potential used in data readout of the memory cell is the Vref 110. When the readout test from the memory cell is performed in this state, the number of defective memory cells included in the overlapped portion 410 shown in FIG. 4 appears, and the defective cells appear in readout of Data 0. Subsequently, the external input signal TM0 is turned to high level (hereafter, it is denoted by H), and the other TM1, TM2 and so on are turned to L. In this case, the reference cell pair 120 is selected, and the reference potential used in data readout of the memory cell is the Vref 120. When the readout test of the memory cell is performed in this state, the defective cells do not appear in data readout of Data 0 and Data 1, and the entire memory cells are accepted. Lastly, the external input signal TM1 is turned to H, and the other TM0, TM2 and so on are turned to L. In this case, the reference cell pair 130 is selected, and the reference potential used in data readout of the memory cell is the Vref 130. When the readout test of the memory cell is performed in this state, the number of defective cells included in the overlapped portion 420 shown in FIG. 4 appears, and the defective memory cells appear in readout of Data 1.

In this manner, by disposing the reference word line control circuit 300 shown in FIG. 3, a single reference cell pair is selected among the plurality of the reference cell pairs by the external input signals TM0, TM1, TM2 and so on, the readout test of the memory cell is performed in each of the reference cell pairs, and the most suitable reference cell pair can also be selected for the memory cell array of the actual semiconductor device. More specifically, in the semiconductor memory device with the ferroelectric capacitor of the embodiment which can select the most suitable reference cell pair, the malfunctions in data readout are reduced, and consequently a highly reliable semiconductor memory device can be provided.

In addition, according to the semiconductor memory device of the embodiment having the reference word line control circuit 300 in which a desired reference cell is selected from a plurality of the reference cells by the external input signals TM0, TM1 and TM2 inputted from the outside of the semiconductor memory device, the most suitable reference cell,pair can be determined in each of semiconductor devices by properly changing the external input signals at the testing stage before the shipment of products. Consequently, it is preferable that highly reliable products can be provided for a short time.

Furthermore, in the semiconductor memory device of the first embodiment, the sizes of the entire memory cells and the reference memory cells (the sizes of the ferroelectric capacitor and the transistor forming of each cell) are nearly the same size. The layout of the ordinary array and the column redundant array can be designed in the same layout by this configuration. Therefore, variations in the exposure and etching processes of the peripheral part are reduced, and the semiconductor memory device can be provided at high yields.

In addition to this, according to the semiconductor memory device of the first embodiment in which the most suitable reference cell pair can be selected by the external input signals among the plurality of the reference cell pairs provided for the bit line pair, the most suitable reference cell pair can again be selected for a desired memory cell after the process step of easily performing imprint that changes the polarization property of the ferroelectric film forming the semiconductor memory device, such as the annealing process included in the fabrication process steps of the semiconductor device. Consequently, the reference potential can be selected in consideration of imprint of the ferroelectric film being the capacitive dielectric of the ferroelectric capacitor, and the reliability of the semiconductor device can be further improved.

Next, a second embodiment according to the invention will be described.

Figure 5:
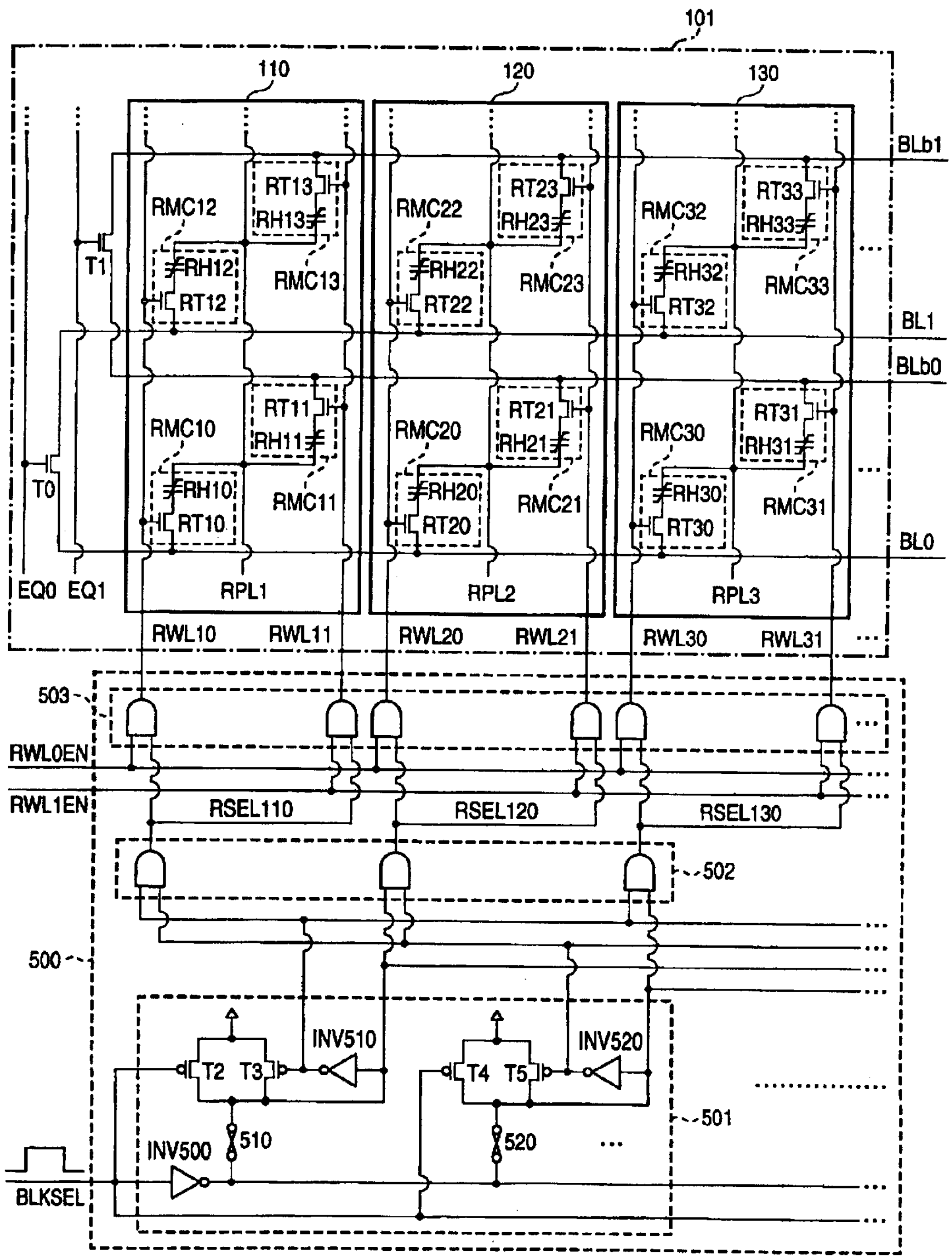
FIG. 5 is a circuit diagram illustrating the essential part of a semiconductor memory device and a circuit diagram illustrating a reference word line control circuit of a second embodiment according to the invention.

FIG. 5 depicts a reference potential generation circuit and a reference word line control circuit in a semiconductor memory device of the second embodiment. In addition, the same reference numerals and signs as those shown in the first embodiment are the same component or corresponding part.

As similar to the first embodiment described before, the semiconductor memory device of the second embodiment is configured to have a reference potential generation circuit formed of reference memory cells RMC10 to RMC13, RMC20 to RMC23, and RMC30 to RMC33 disposed at the intersections of bit lines BL and complementary bit lines BLb with reference word lines RWL10, RWL11, RWL20, RWL21, RWL30 and RWL31; memory cells MC10 to MC13 and MC20 to MC23 connected to the reference potential generation circuit through the bit lines BL and the complementary bit lines BLb and disposed at the intersections of word lines WL10 and WL11 for storing data; sense amplifier circuits SA connected between the bit lines BL and the complementary bit line BLb for amplifying signals of the memory cells; and a reference word line control circuit that receives a block select signal BLKSEL and reference word line enable signals RWL0EN and RWL1EN to output a select signal for selecting a single reference cell pair among a plurality of reference cell pairs.

The data readout and write operation of the memory cell in the semiconductor memory device of the second embodiment is the same as that of the traditional semiconductor memory device.

However, in the case of the second embodiment, the reference word line control circuit has logic fuses in which a desired reference cell pair is selected depending on the state of the fuses to be cut or uncut. More specifically, according to the configuration of the reference word line control circuit in the second embodiment, the select signal for selecting the reference cell pair can be generated from a signal internally created for use such as the block select signal BLKSEL, not from the external input signals.

To the reference word line control circuit of the second embodiment, the reference word line enable signals RWL0EN and RWL1EN and the block select signal BLKSEL are inputted, the reference word line enable signals RWL0EN and RWL1EN are the signals that activate any one of a plurality of the reference word lines RWL (RWL10 or RWL11, RWL20 or RWL21, RWL30 or RWL31) in each of the reference cell pairs and select whether to generate the reference potential in bit lines BL0, BL1 and so on or in complementary bit lines BLb0, BLb1 and so on, and the block select signal BLKSEL is the signal that selects a desired block to operate among a plurality of blocks in a semiconductor device, for example. The reference word lines RWL10, RWL11 and so on for the reference cell pairs are selected and controlled by fuses 510 and 520 that have been cut by laser beam irradiation beforehand.

As similar to the reference word line control circuit of the first embodiment described before, a reference word line control circuit 500 shown in FIG. 5 is also configured to provide three reference cell pairs 110, 120 and 130 for a single bit line pair connected to the reference word line control circuit 500.

The reference word line control circuit 500 has reference word line enable signal lines RWLENL to which the reference word line enable signals RWL0EN and RWL1EN are inputted; a block select signal line BSEL to which the block select signal BLKSEL is inputted that is internally created and used in a semiconductor device, changing from L to H to L, for example; fuses 510 and 520 disposed between the reference word line enable signal lines RWLENL and the block select signal line BSEL, to which the inverted signal of the block select signal BLKSEL is inputted; and a select circuit 501 having switching transistors T2 and T4 connected to the output side of the fuses 510 and 520 to be controlled by the block select signal BLKSEL and switching transistors T3 and T5 similarly connected to the output side of the fuses 510 and 520 to be controlled by the inverted signals of the output signals of the fuses 510 and 520.

The reference word line enable signals RWL0EN and RWL1EN and the block select signal BLKSEL internally used are inputted to the reference word line control circuit 500 of the second embodiment shown in FIG. 5, which has a first AND circuit 502 inputted with the output of the select circuit 501 to which the block select signal BLKSEL has been inputted and a second AND circuit 503 inputted with the reference word line enable signals RWL0EN and RWL1 EN and the output of the first AND circuit 502.

Hereafter, a method for selecting a reference cell pair 120 will be described by the reference word line control circuit shown in FIG. 5.

In addition, Data 0 is written into the reference cell RMC23 and Data 1 is written into the reference cell RMC21 beforehand, and the fuse 510 connected to the transistors T4 and T5 is cut by laser beam irradiation.

First, the block select signal BLKSEL is turned to H, the RSEL120 is turned to H among the reference cell pair select signals RSEL110, RSEL120 and RSEL130, and the other RSEL110 and RSEL130 are turned to L. Subsequently, a reference plate line RPL2 and the reference word line enable signal RWL1EN are turned to H, and the reference word line RWL21 is turned to H.

Thus, data of the reference cell RMC23 into which Data 0 has been written is transferred to the complementary bit line BLb1, the potential of the BLb1 is turned to ΔV0, data of the reference cell RMC21 into which Data 1 has been written is transferred to the complementary bit line BLb0, and the potential of the BLb0 is turned to ΔV1.

After that, the bit line equalizer signal EQ1 is turned to H, and the switching transistor T1 is turned to an ON state to short-circuit between the complementary bit lines BLb0 and BLb1. Thus, the reference potential Vref 120 having been generated by the reference cell pair 120 including the reference cells RMC21 and RMC23 is generated in the complementary bit line BLb0 and BLb1.

According to the semiconductor memory device of the second embodiment in which the block select signal BLKSEL internally generated is used to create the select signal for the reference cell pair, the reference cell pair for use can be determined based on the state of the fuses (cut/uncut) without externally inputting a specific signal. Consequently, the number of terminals of a semiconductor device disposed outside can be reduced.

In addition, in the embodiment, the method that the fuse 510 is cut to generate the reference potential Vref 120 in the bit line BLb is exemplified for description. However, any fuse is not cut when the reference potential Vref 110 is generated, whereas the fuse 520 is cut by laser beam and then the reference potential is generated by the method described above when the reference potential Vref 130 is generated. Accordingly, a desired level of the reference potential can be generated properly.

Furthermore, as similar to the first embodiment described before, the semiconductor memory device of the second embodiment can also adopt the memory cell array configuration configured of the ordinary array formed of the plurality of the replacement units 210 to 21*m* and the column redundant array 21, and can form the configuration of providing a plurality of the reference cell pairs for each of the replacement units and each of the bit line pairs of the column redundant array.

Figure 6:
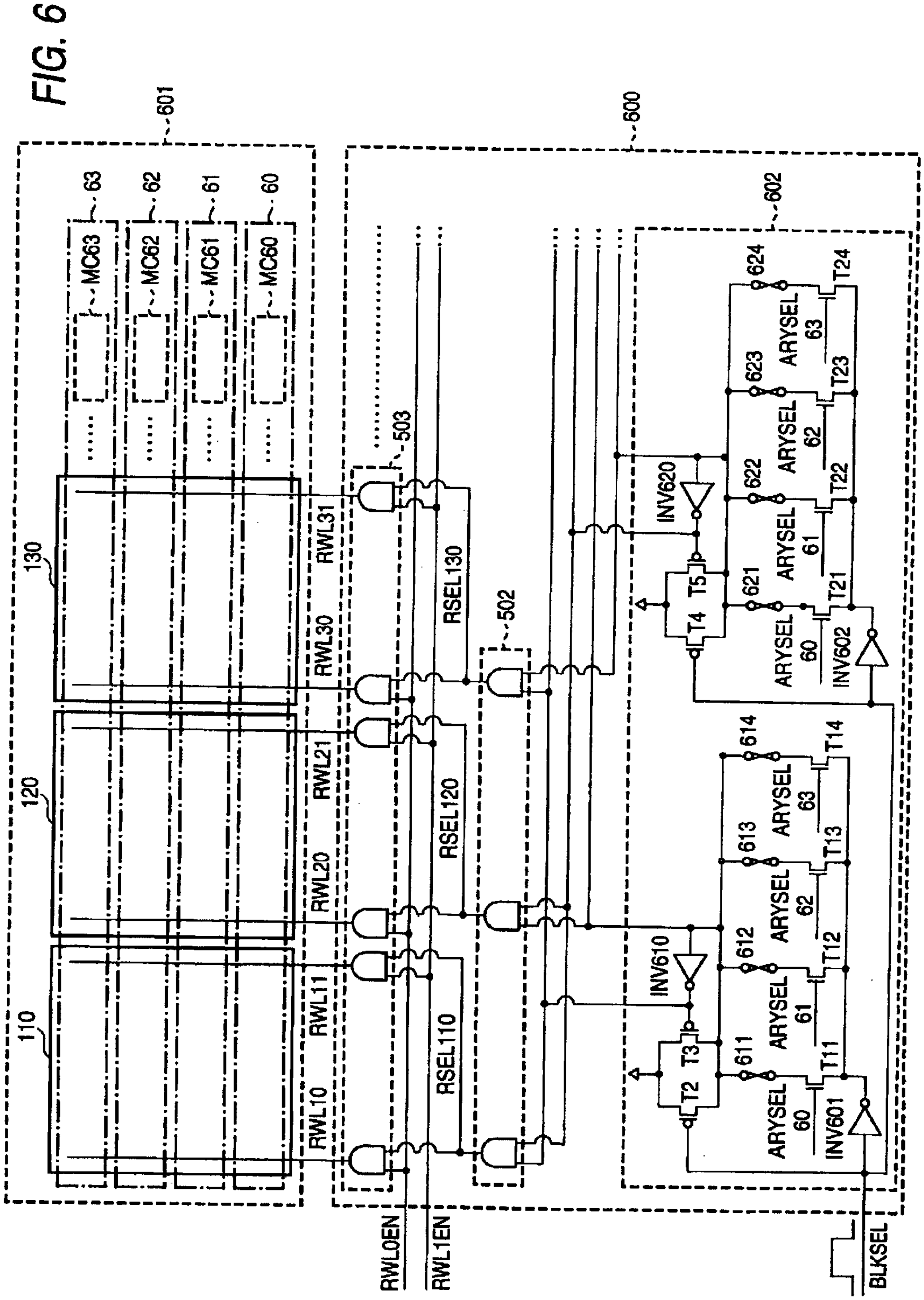
FIG. 6 is a circuit diagram illustrating the essential part of the semiconductor memory device and a circuit diagram illustrating another reference word line control circuit of the second embodiment according to the invention.
Figure 7:
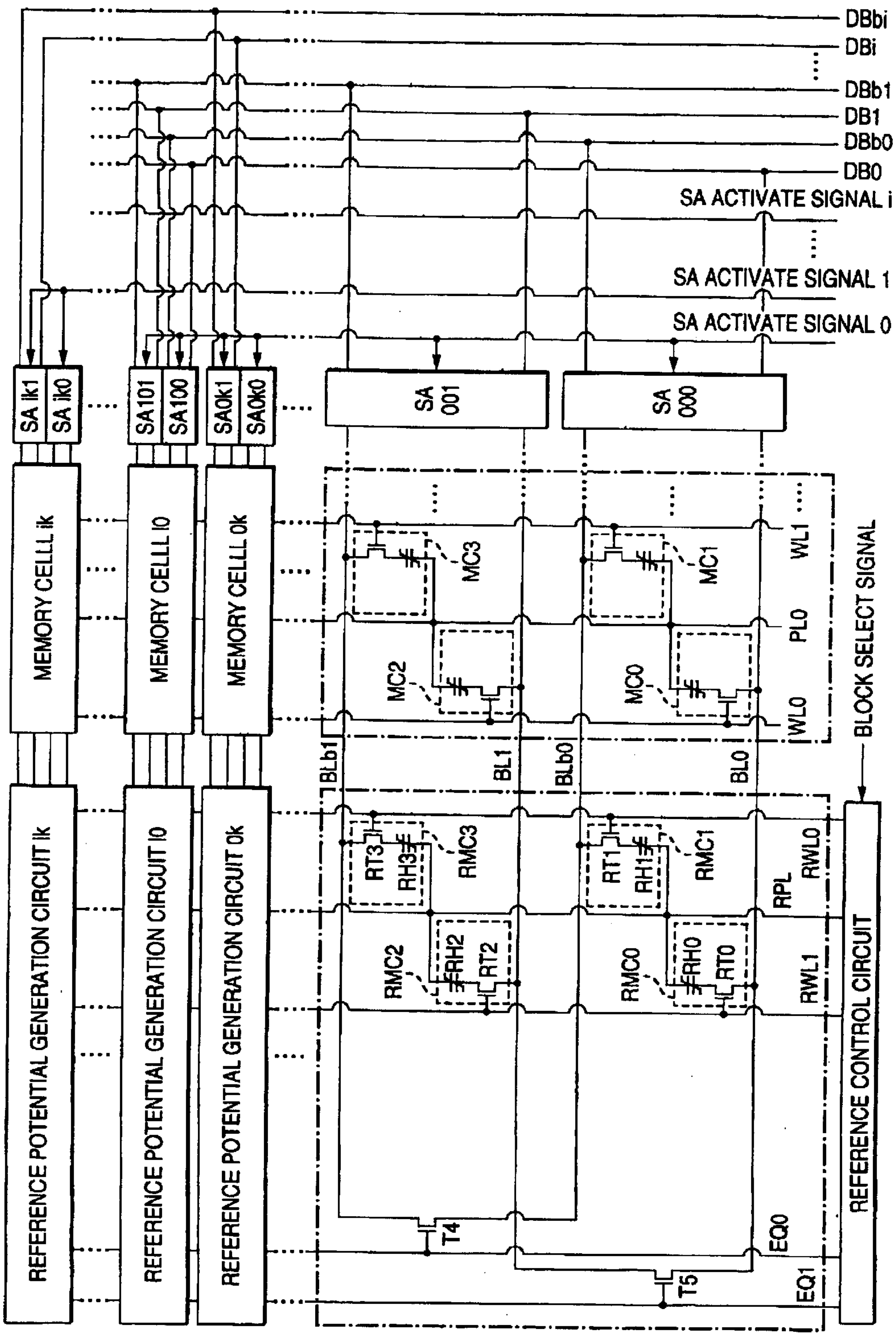
FIG. 7 is a circuit diagram illustrating the essential part of the traditional semiconductor memory device.

Moreover, in the semiconductor memory device of the second embodiment, in the case where the array block configuration is adapted which has a plurality of the memory cell arrays formed of the plurality of the replacement units and the column redundant array, it can be replaced by a reference word line control circuit shown in FIG. 6 having fuses 611 to 614 and 621 to 624 connected in parallel between reference word line enable signal lines RWLENL and a block select signal line BSEL, the fuses can be cut by laser beam, and switching transistors T11 to T14 and T21 to T24 serially connected to each of the fuses to be controlled by array select signals ARYSEL.

For example, in the case of selecting a reference cell pair 120 in an array 60, a reference cell pair 130 in an array 61, a reference cell pair 110 in an array 62, and the reference cell pair 120 in an array 63, the fuses 611, 622 and 614 of the reference word line control circuit shown in FIG. 6 are cut beforehand. After that, in the case of selecting the array 60 in an array block 601 by an address externally inputted, an array select signal ARYSEL 60 for selecting the array 60 is turned to H. At this time, the other array select signals ARYSEL are L. Thus, a reference cell pair select signal RSEL120 is turned to an active state to activate reference word lines RWL21 and RWL22, and the reference cell pair 120 is selected. Similarly, in the case of selecting the array 61, an array select signal ARYSEL61 for selecting the array 61 is turned to H. Thus, the reference cell pair select signal RSEL130 is turned to an active state to activate reference word lines RWL31 and RWL32, and the reference cell pair 130 is selected. Furthermore, an array select signal ARYSEL62 is turned to H and a reference cell pair select signal RSEL110 is turned to an active state when selecting the array 62, whereas a reference cell pair select signal RSEL 120 is turned to an active state when selecting the array 63. Accordingly, a desired reference cell pair can be selected at each array.

In this manner, according to the semiconductor memory device adopting the reference word line control circuit shown in FIG. 6, the use of the array select signals ARYSEL and the fuses 611 to 614 and 621 to 624 can select the most suitable reference cell pair for each of the array 60 to 63 forming the array block.

More specifically, since a response can properly be given to the variation of the polarization property (the difference in the hysteresis curves) of the ferroelectric film forming the memory cells caused by process variations in the memory cell part area, a more highly reliable semiconductor memory device can be provided.

Moreover, in the semiconductor memory device of the first and second embodiments, the configuration of providing two or three reference cell pairs for a single bit line pair is exemplified for description. However, in the invention, the number of the reference cell pairs provided for a single bit line pair is not limited to this. Desirably, a large number of reference cell pairs are provided for a single bit line pair when the number is plurals.

As described above, according to the invention having the reference potential generation circuit that provides a plurality of the reference cell pairs for a single bit line pair and the reference word line control circuit that selects the most suitable reference cell pair among a plurality of the reference cell pairs, even though a reference cell under defective conditions is included, another reference cell pair can be selected from the plurality of the reference cell pairs. Accordingly, the malfunctions of normal memory cells with the defective conditions of a single reference memory cell can be avoided. More specifically, the yields of the memory cell array can be improved.

In addition, according to the semiconductor memory device of the invention having the reference word line control circuit that can select the most suitable reference cell pair, the reference cell pair to generate the reference potential suitable for each of the memory cells is selected by the reference word line control circuit, and thus the malfunctions in data readout are reduced. Consequently, a highly reliable semiconductor memory device can be provided.

What is claimed is:

1. A semiconductor memory device comprising:

a first bit line;

a memory cell formed of a first transistor connected to the first bit line and a first ferroelectric capacitor connected to the first transistor;

a second bit line;

a first reference cell formed of a second transistor connected to the second bit line and to a first word line to be controlled and a second ferroelectric capacitor connected to the second transistor, the first reference cell holding a potential corresponding to predetermined data;

a third bit line;

a second reference cell formed of a third transistor connected to the third bit line and to the first word line to be controlled and a third ferroelectric capacitor connected to the third transistor, the second reference cell holding a potential corresponding to predetermined data;

a first redundant reference cell formed of a fourth transistor connected to the second bit line and to a second word line to be controlled and a fourth ferroelectric capacitor connected to the fourth transistor, the first redundant reference cell holding a potential corresponding to predetermined data;

a second redundant reference cell formed of a fifth transistor connected to the third bit line and to the second word line to be connected and a fifth ferroelectric capacitor connected to the fifth transistor, the second redundant reference cell holding a potential corresponding to predetermined data;

a switching circuit connected between the second bit line and the third bit line, the switching circuit electrically connecting the second bit line to the third bit line in response to a first control signal and generating a reference potential in the second bit line and the third bit line;

a data read-out circuit connected to any one of the second bit line and the third bit line and to the first bit line so as to compare the reference potential with a potential generated in the first bit line; and a word line select circuit selecting any one of the first word line and the second word line and generating the reference potential in the second bit line and the third bit line by the first and second redundant reference cells by selecting the second word line when the first or second reference cell is defective.

2. The semiconductor memory device according to claim 1, wherein the word line select circuit selects the first word line or second word line in accordance with a polarization state of the first ferroelectric capacitor.

3. The semiconductor memory device according to claim 1, wherein cell sizes of the first and second redundant reference cells and the first and second redundant reference cells are nearly a same size.

4. The semiconductor memory device according to claim 1, wherein the word line select circuit has an AND circuit to which a word line enable signal for activating the first and second word lines and an external input signal to be externally inputted are inputted, the AND circuit has a logical multiplication of the word line enable signal and the external signal, in which any one of the first word line or second word line is selected by an output of the AND circuit.

5. The semiconductor memory device according to claim 1, wherein the word line select circuit has a word line enable signal line to which a word line enable signal for activating the first or second word line is inputted, an internal signal line to which an internal signal to be used in the semiconductor memory device is inputted, and a fuse circuit connected between the word line enable signal line and the internal signal line, in which any one of the first word line and the second word line is selected by an output of an AND circuit to have a logical multiplication of the word line enable signal for activating the first or second word line and an output signal from the fuse circuit being the internal signal.

6. The semiconductor memory device according to claim 1, wherein the potential generated in the second bit line or third bit line to be compared with the potential generated in the first bit line by the data read-out circuit is an intermediate potential of a potential applied to the second bit line by the first reference cell or first redundant reference cell and a potential applied to the third bit line by the second reference cell or second redundant reference cell.

7. The semiconductor memory device according to claim 1 further comprising:

an array part formed of the first, second and third bit lines, the memory cell, the first and second reference cells, the first and second redundant reference cells, the switching circuit, and the data read-out circuit; and an array block formed of a plurality of the array parts, wherein the word line select circuit has a word line enable signal line to which a word line enable signal activating the first or second word line is inputted, an internal signal line to which an internal signal to be used in the semiconductor memory device is inputted, a select circuit connected between the word line enable signal line and the internal signal line, and an AND circuit to which the word line enable signal and an output signal from the select circuit being the internal signal are inputted, in which the select circuit has a plurality of fuse circuits connected in parallel, and a plurality of switching circuits connected to each of the fuse circuits to be controlled by an array select signal selecting any one of the array parts among the plurality of the array parts.

8. A semiconductor memory device comprising:

an ordinary array;

wherein the ordinary array having, a first bit line;

a first memory cell formed of a first transistor connected to the first bit line and a first ferroelectric capacitor connected to the first transitor;

a second bit line;

a first reference cell formed of a second transistor connected to the second bit line and to a first word line to be controlled and a second ferroelectric capacitor connected to the second transistor, the first reference cell for holding a potential corresponding to predetermined data;

a third bit line;

a second reference cell formed of a third transistor connected to the third bit line and to the first word line to be controlled and a third ferroelectric capacitor connected to the third transistor, the second reference cell holding a potential corresponding to predetermined data;

a first redundant reference cell formed of a fourth transistor connected to the second bit line and to a second word line to be controlled and a fourth ferroelectric capacitor connected to the fourth transistor, the first redundant reference cell holding a potential corresponding to predetermined data;

a second redundant reference cell formed of a fifth transistor connected to the third bit line and to the second word line to be controlled and a fifth ferroelectric capacitor connected to the fifth transistor, the second redundant reference cell holding a potential corresponding to predetermined data;

a first switching circuit connected between the second bit line and the third bit line, the switching circuit electrically connecting the second bit line to the third bit line in response to a first control signal and generating a first reference potential in the second bit line and the third bit line; and a first data read-out circuit that is activated by a first activating signal and connected to any one of the second bit line or third bit line and to the first bit line so as to compare the first reference potential with a potential generated in the first bit line;

a redundant array;

wherein the redundant array having, a fourth bit line;

a second memory cell formed of a sixth transistor connected to the fourth bit line and a sixth ferroelectric capacitor connected to the sixth transistor;

a fifth bit line;

a third reference cell formed of a seventh transistor connected to the fifth bit line and to the first word line to be controlled and a seventh ferroelectric capacitor connected to the seventh transistor, the third reference cell holding a potential corresponding to predetermined data;

a sixth bit line;

a fourth reference cell formed of an eighth transistor connected to the sixth bit line and to the first word line to be controlled and an eighth ferroelectric capacitor connected to the eighth transistor, the fourth reference cell holding a potential corresponding to predetermined data;

a third redundant reference cell formed of a ninth transistor connected to the fifth bit line and to the second word line to be controlled and a ninth ferroelectric capacitor connected to the ninth transistor, the third redundant reference cell holding a potential corresponding to predetermined data;

a fourth redundant reference cell formed of a tenth transistor connected to the sixth bit line and to the second word line to be controlled and a tenth ferroelectric capacitor connected to the tenth transistor, the fourth redundant reference cell holding a potential corresponding to predetermined data;

a second switching circuit connected between the fifth bit line and the sixth bit line, the switching circuit electrically connecting the fifth bit line to the sixth bit line in response to the first control signal and generating a second reference potential in the fifth bit line and the sixth bit line;

a second data read-out circuit that is activated by a second activating signal and connected to any one of the fifth bit line and the sixth bit line and to the fourth bit line so as to compare the second reference potential with a potential generated in the fourth bit line; and a word line select circuit selecting any one of the first word line and the second word line, generating the reference potential in the second bit line and the third bit line by the first and second redundant reference cells by selecting the second word line when the first or second reference cell is defective, and generating the reference potential in the fifth bit line and the sixth bit line by the third and fourth redundant reference cells by selecting the second word line when the third or fourth reference cell is defective.

9. The semiconductor memory device according to claim 8, wherein the word line select circuit selects the first word line or second word line in accordance with a polarization state of the first ferroelectric capacitor and the sixth ferroelectric capacitor.

10. The semiconductor memory device according to claim 8, wherein cell sizes of the first, second, third and fourth reference cells and the first, second, third and fourth redundant reference cells are nearly a same size.

11. The semiconductor memory device according to claim 8, wherein the word line select circuit has an AND circuit to which a word line enable signal to activate the first and second word lines and an external input signal to be externally inputted are inputted, the AND circuit has a logical multiplication of the word line enable signal and the external signal, in which any one of the first word line or second word line is selected by an output of the AND circuit.

12. The semiconductor memory device according to claim 8, wherein the word line select circuit has a word line enable signal line to which a word line enable signal to activate the first or second word line is inputted, an internal signal line to which an internal signal to be used in the semiconductor memory device is inputted, and a fuse circuit connected between the word line enable signal line and the internal signal line, in which any one of the first word line and the second word line is selected by an output of an AND circuit to have a logical multiplication of the word line enable signal to activate the first or second word line and an output signal from the fuse circuit being the internal signal.

13. The semiconductor memory device according to claim 8, wherein the word line select circuit has a word line enable signal line to which a word line enable signal to activate the first or second word line is inputted, an internal signal line to which an internal signal to be used in the semiconductor memory device is inputted, a select circuit connected between the word line enable signal line and the internal signal line, and an AND circuit to which the word line enable signal and an output signal of the select circuit being the internal signal are inputted, in which the select circuit has a plurality of fuse circuits connected in parallel and a plurality of switching circuits connected to each of the fuse circuit to be controlled by an array select signal to select any one of the ordinary array or redundant array.

14. The semiconductor memory device according to claim 8, wherein the potential generated in the second bit line or third bit line to be compared with the potential generated in the first bit line by the data read-out circuit is an intermediate potential of a potential applied to the second bit line by the first reference cell or first redundant reference cell and a potential applied to the third bit line by the second reference cell or second redundant reference cell, and the potential generated in the fifth bit line or sixth bit line to be compared with the potential generated in the fourth bit line by the data read-out circuit is an intermediate potential of a potential applied to the fifth bit line by third reference cell or third redundant reference cell and a potential applied to the sixth bit line by the fourth reference cell or fourth redundant reference cell.

* * * * *